United States Patent [19]
Llewellyn et al.

[11] Patent Number: 6,127,893
[45] Date of Patent: Oct. 3, 2000

[54] METHOD AND APPARATUS FOR CONTROLLING AN AUDIO SIGNAL LEVEL

[75] Inventors: William D. Llewellyn; Cary L. Delano, both of San Jose, Calif.

[73] Assignee: Tripath Technology, Inc., Santa Clara, Calif.

[21] Appl. No.: 09/156,262

[22] Filed: Sep. 18, 1998

[51] Int. Cl.[7] ........................................ H03G 3/10

[52] U.S. Cl. ............................. 330/284; 330/254

[58] Field of Search ............................. 330/69, 86, 129, 330/282, 284, 254

[56] References Cited

U.S. PATENT DOCUMENTS 5,285,169  2/1994  Theus ........................................ 330/254
5,408,199  4/1995  Nagano et al. ........................... 330/284

*Primary Examiner*—Steven J. Mottola
*Attorney, Agent, or Firm*—Beyer Weaver & Thomas, LLP

[57] ABSTRACT

A control circuit for controlling a level of an audio signal and transmitting the signal to an amplifier is described. The control circuit is based on an R-2R resistor network having a plurality of resistor nodes. A plurality of switches alternately connects each of the plurality of resistor nodes to one of a plurality of low impedance nodes and a low impedance input node associated with the amplifier. Switch control circuitry selectively controls the plurality of switches to transmit the audio signal to the low impedance input node.

17 Claims, 5 Drawing Sheets

METHOD AND APPARATUS FOR CONTROLLING AN AUDIO SIGNAL LEVEL

BACKGROUND OF THE INVENTION

The present invention relates to techniques for controlling the level of a signal. More specifically, the present invention provides methods and apparatus for controlling the level of an audio signal.

Virtually all audio amplification systems require a means of controlling the overall gain of the signal path. Such gain control enables the system engineer to optimize signal levels to fit the dynamic range of the system and allows end-users to adjust the loudness or volume of the amplified sound to suite comfort levels or taste. Volume control can be achieved by means including variable resistive elements, e.g., potentiometers, in the analog audio path, variable gain amplifiers (VGAs) in the analog audio path, and multiplication of digitized audio by a digital volume control word.

In multi-channel systems such as 2-channel conventional stereo or 4–6 channel surround audio systems, potentiometers ("pots") are often ganged on a common rotational shaft such that all channels receive roughly the same degree of gain control. Alternatively, multiple VGAs can be used for a plurality of channels, each receiving the same gain control signal as all others, in order to achieve a uniform overall gain setting. In the digital domain, each audio channel receives the appropriate digital gain parameter value.

In the case where individual channel gains need to have a relative offset but still track together globally, such as in left/right balance (pan) or interchannel trimming, additional potentiometers can be added to the pot-based system in series with the master volume control or a slip clutch mechanism can be used to allow individual pot adjustability in the ganged pot configuration. Also, per-channel offsets can be added to the global gain control signal in VGA-based systems, and numerical offsets can be similarly implemented between the channel gain parameters in the digital system.

Audio volume control circuits must typically satisfy a broad range of requirements. For example, such circuits should have a logarithmic transfer function to match the nature of human loudness perception. A logarithmic transfer function is achieved in pot-based systems by the use of "audio taper" pots which have a logarithmic variation in their resistance as a function of shaft rotation. This works well in most applications, with the disadvantage that it can be difficult to inexpensively manufacture pots which can precisely match one another for ganged use. As a result, in modestly priced audio systems differences between channel volumes at low volume settings are often easily perceived. In VGA-based systems, the logarithmic volume variation is implemented by mapping of the control signal from linear input (e.g., a voltage from a potentiometer or DAC) into the appropriate logarithmic form. Alternatively, the control voltage can be derived from an audio taper pot. In digital volume control systems, the logarithmic volume steps can be achieved with a mapping function, e.g., from a simple look-up table.

Audio volume control circuits must also exhibit low noise. Potentiometers, since they are passive devices, contribute no active noise to the signal path, but can degrade audio signals with resistor thermal noise, and discontinuity noise from, for example, a dirty wiper contact. In some cases pots also allow electromagnetic interference to enter the audio path due to inadequate shielding. VGAs are active devices akin to operational amplifiers and therefore inherently contribute some degree of noise. This noise can be minimized with adequate design techniques, but this comes at additional cost due to larger signal handling transistors or increased bias current in gain stages. In digital volume control systems, if implemented exclusively in the digital domain, the system noise is governed by the bit resolution of the system following the volume control block. For example, if one has a 16-bit digital audio system with digital-only volume control, this implies that full output loudness correlates to activity in all 16 bits at the DAC which drives the power amplifier. If one then sets the volume to be ¼ of the maximum available dynamic range, i.e., a volume reduction of 2 bits, one is left only using 14 bits at the DAC—a distinct cut in resolution. Also, noise and distortion products contributed by the DAC and any subsequent EQ are not attenuated when volume is reduced. The noise floor can thus become apparent at even normal volume settings. It is for this reason that all-digital volume controls are usually not used, and instead a hybrid of pre-DAC digital control and post-DAC analog control is used if the system is to include any volume control in the digital domain.

Audio volume control circuits must also exhibit low distortion. Passive, potentiometer-based volume control systems are essentially distortionless. The exception to this might be very slight voltage-based resistor value dependencies. VGAs are active amplification devices and are therefore subject to the usual set of non-ideal characteristics inherent in any active gain block which can contribute to overall distortion. All-digital volume controls could potentially suffer from distortion due to truncation or rounding errors in the multiplication process.

Audio volume control circuits must also exhibit transition smoothness. Changes from one gain setting to another should be done on a gradual scale to prevent the introduction of audible artifacts into the audio. After all, gain control is actually the multiplication of the hi fidelity audio signal(s) with a quasi-static control signal, and any aberrant behavior in the control signal will produce modulation products in the audio signal. The "trick" is to keep all variations in the gain control signal sufficiently gradual, e.g., with frequency components below 10 Hz, and/or small in amplitude, such that the modulation products remain unnoticeable or unobtrusive. Hand-operated potentiometers inherently provide a relatively slow and smooth transition from one gain setting to the next by virtue of the limited rate at which the human operator can turn the control knob. If, however, the potentiometer(s) is (are) operated by a stepper motor (as in the case of remote control) there is more risk that the individual stair steps of volume change will be noticeable, depending on the servo-stepper design. In VGA systems, the gain control signal must be made to ramp smoothly between gain settings even if the command to change is a step function. This is easily achieved if the signal is derived from a continuous source such as a pot, but requires more care if the control signal is derived from a more coarse source such as a DAC. In digital volume control systems, smaller, intermediate gain steps can be added between allowed volume setting increments, permitting the control algorithm to more closely approximate a smooth ramp during volume changes. For example, if the volume control is only allowed to sit on integer dB positions such as 0 dB, −1 dB, −2 dB, and so forth, it could be made to micro-step between these steps in ¼ dB increments to reduce the audibility of the 1 dB steps.

Audio volume control circuits must also enable precise tracking between channels in multi-channel systems. That is, where two or more channels are involved, it is usually desirable that the volume control function for each channel closely match that of the others throughout its entire gain control range. Offsets can be intentionally introduced between channel gains for purposes of left/right balance or front/rear inter-channel trimming, but once these offsets are determined it is again necessary for all channels to faithfully track the master gain control signal in proper proportion. In potentiometer-based systems, as mentioned, pots are often physically ganged onto a single, rotating shaft to achieve tracking. Left/right balance or inter-channel trimming can be achieved either by the use of concentric shafts controlling the individual pots with a slip-clutch mechanism to achieve a ganging function with relative adjustability, or by the use of additional pots in series with each channel for balance/ trimming. The former method has the disadvantage of mechanical complexity and does not function well at very low or very high volume settings because one offset channel will hit the the extreme stop point before the other(s). The latter method has the disadvantage of requiring more pots. In a VGA system, it becomes necessary to use VGAs which have closely matched gain control functions. In the digital domain, precise tracking is easily implemented given the exacting nature of the digital calculations involved.

Audio volume control circuits must also exhibit a wide dynamic range. A typical operating range for a volume control system is 80–100 dB gain variation. Ideally, a volume control system would be able to pass all 96 dB of the dynamic range contained in a commercial CD recording even when at its minimum gain setting, implying a signal path dynamic range of nearly 196 dB. Of course at minimum gain setting (before muting altogether) the volume is so low that much or most the 96 dB of the CD recording is lost to human hearing, so the 196 dB figure is unnecessary in practical terms. Nonetheless, it will be understood that the dynamic range required of a good volume control circuit is well in excess of the audio program material which it passes. For potentiometer-based volume controls this is generally not a problem, since the passive nature of the resistor usually adds little noise (if low in resistive value and appropriate material is used) and virtually no distortion. Low distortion is more of a challenge for the VGA system because of the active nature of the gain-controlling amplifier circuitry. The VGA will add some limited degree of distortion which usually increases with lower gain settings. As discussed above, it will also add some degree of noise. In an all-digital volume control system the output of the volume control block would have to be of significantly more bits than 16 to achieve the type of dynamic range which is desirable. For example, if the volume control word is 8-bits and the audio 16-bits, the resulting gain-controlled output would be 24-bits. This 24-bit word would have to pass through an equivalent 24-bit DAC before being fed to the power amplifier. And, as will be understood, a DAC of that resolution is prohibitively expensive. Some would even debate whether true 24-bit DACs are actually realizable with today's technology.

Digital control is also desirable for audio volume control circuits. With the advent of digitally operated audio equipment such as remote-controlled home stereo receivers, televisions, and other home entertainment systems, the need arose for the digitally operated volume control. Here, a relatively low resolution binary control word of perhaps 6 to 8 bits (i.e., 64 to 256 levels) is used to select gain levels over the operating range of the volume control in a logarithmic scale. This can be applied in potentiometer-based volume control systems with the use of a remotely operated stepper motor actuating the rotary shaft of the pot(s). The added cost and undesirable complexity of such a setup is relatively easy to imagine. In VGA-based systems, a DAC can be used to receive control commands from some remote source and convert them into gain control signal(s) as appropriate. In all-digital systems, the volume control word (appropriately mapped into logarithmic form) is simply multiplied by the audio signal to produce a volume-controlled result.

Reliability is, of course, a desirable characteristic of volume control circuits. A potentiometer is an electromechanical item which is subject to the deleterious effects of heat, moisture, dust, corrosion, vibration, and simple wear and tear. In many consumer electronic devices, it is among the first subsystems of the product which develop problems, usually due to dirt or dust contamination. In addition, if a motor of some sort is used to actuate the potentiometer digitally or remotely, the electromechanical complexity increases and reliability correlatively decreases. VGAs and digital volume control implementations are built mostly or completely from discrete or integrated semiconductors with perhaps some passive components, and exhibit the high degree of reliability associated with such components.

It is also desirable that audio volume control circuits are both easy to implement and easy to use. A potentiometer or even a gang of two or more is very easily incorporated into an audio system as well as easily operated. This is less true if a stepper motor actuator is employed for digital or remote control. A VGA system is relatively easily designed by an experienced circuit designer, but can be somewhat complex. Digital implementation is fairly straightforward to an experienced digital ASIC designer but adds complexity to the DAC design.

System simplification and cost reduction by means of circuit integration is also essential in most audio marketplace sectors. A single, ganged, or servo-driven potentiometer simply cannot be integrated into an IC. The VGA approach can be integrated, but makes for a fairly complex analog IC function if high performance is targeted. The digital approach, of course, integrates naturally.

Finally, low cost is desirable for audio volume control circuits. Single or double-gang potentiometers are inexpensive. Concentric slip-clutch potentiometers are more costly, and pot combinations which are sealed against dust and have good inter-pot tracking are even more expensive. When a servo operation mechanism is added, the cost goes up dramatically. VGAs are not particularly expensive, but are more costly than op amps of similar performance ratings simply because they are sold in lower quantities. A digital volume control implementation has only a small incremental cost associated with it because it comprises only a modest number of gates with respect to the usual complexity of a digital audio ASIC of which it would be a part.

It is clear from the above discussion that each of the currently available techniques for implementing volume control in audio systems has its disadvantages with regard to at least some of the desirable characteristics of volume control circuitry. It is therefore desirable to provide volume control technology which exhibits all of these characteristics as well or better than the technologies discussed above.

SUMMARY OF THE INVENTION

According to the present invention, a level control circuit is provided which satisfies all of the requirements described above at least as well or better than any of the above-described technologies. The present invention takes advantage of the logarithmic characteristic of what is known as an R-2R resistor network topology to precisely attenuate an incoming analog audio signal in 6 dB steps for any number of channels. The 2R resistors are selectively switched between ground and the virtual ground represented by the input of an operational amplifier following the R-2R network. Because the operation of the network is essentially independent of the base resistor value of the network, R may be kept low thereby minimizing the contribution to system noise due to resistor thermal noise. Moreover, because the switches which selectively couple the R-2R network to the operational amplifier (and which therefore pass the audio signal) experience no voltage variations at their terminals, distortion due to such variations is virtually eliminated. According to one embodiment, a variable gain amplifier is included in series with the R-2R network to provide intermediate gain selections between the 6 dB steps in increments of 1 dB. According to another embodiment, two R-2R networks are interposed between differential operational amplifiers. The level control circuit of the present invention may be employed, for example, to control the output level of an audio component such as an audio amplifier.

Thus, the present invention provides a circuit comprising an R-2R resistor ladder having a plurality of resistor nodes. A plurality of switches are coupled to the plurality of resistor nodes for connecting each of the plurality of resistor nodes to one of a plurality of low impedance nodes.

According to a more specific embodiment, a control circuit is provided for controlling the level of a signal and transmitting the signal to an amplifier. The control circuit is based on an R-2R resistor network having a plurality of resistor nodes. A plurality of switches alternately connects each of the plurality of resistor nodes to one of a plurality of low impedance nodes and a low impedance input node associated with the amplifier. Switch control circuitry selectively controls the plurality of switches to transmit the signal to the low impedance input node.

A further understanding of the nature and advantages of the present invention may be realized by reference to the remaining portions of the specification and the drawings.

DESCRIPTION OF SPECIFIC EMBODIMENTS

Figure 1:
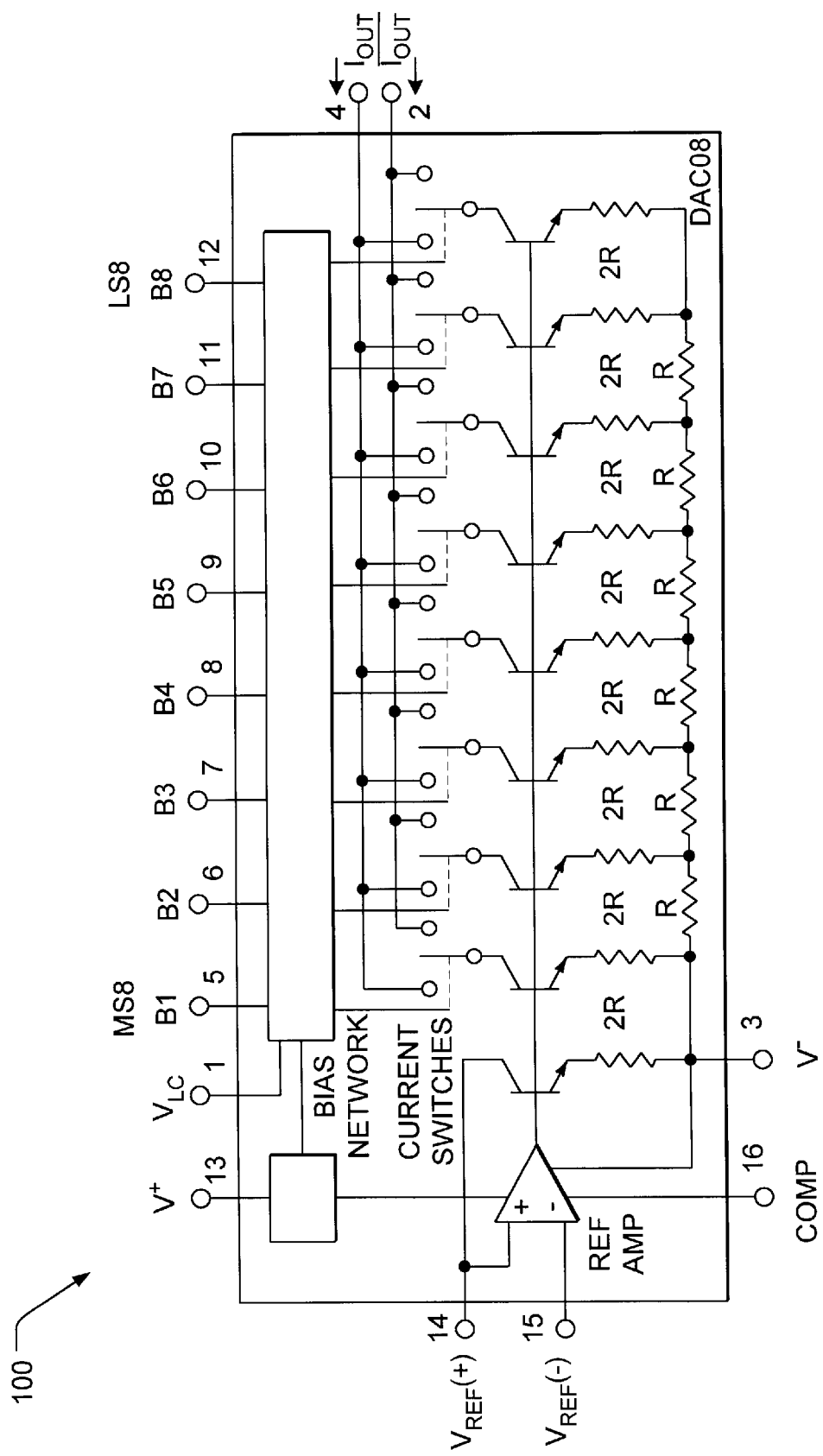
FIG. 1 is a schematic diagram of a digital-to-analog converter (DAC) based on an R-2R network topology.

FIG. 1 shows a current DAC 100 based on the well known R-2R resistor network topology. The level control circuit of the present invention is based on this topology. According to a specific embodiment of the invention, the choice was made to use an analog scheme to avoid the dynamic range issues associated with a fully-digital approach and to accommodate the fact that most audio sources today are analog. Also, resistors were chosen as the gain setting elements instead of VGAs because they have low noise and distortion (if kept low in value), and can be matched extremely well when integrated. In order to achieve a logarithmic gain control transfer function, a binary DAC topology, i.e., the R-2R resistor network, was chosen as a basic building block. The weighting of the binary elements from which the DAC is constructed naturally have a logarithmic relationship to one another. That is, the current sinks of the DAC in FIG. 1 are weighted as 1.0, 0.5, 0.25, 0.125, and so on. This weighting inherently provides 6 dB steps. The present invention passes an audio signal through an R-2R topology by applying an audio voltage to the network and engaging only one current sink at a time, thereby achieving logarithmic volume control with 6 dB steps. The 6 dB steps are, of course, too large in that a typical digitally-controlled volume control has 1 dB steps. However, according to various embodiments of the invention, 1 dB intermediate gain selections between the 6 dB steps may be approximated by a variety of techniques.

The "R-2R" topology of current DAC 100 also demonstrates a very efficient scheme for producing logarithmically related currents down to very small values without the need for very large value resistors. If, for example, all eight 2R emitter degeneration resistors were tied directly to V-(i.e., if one replaced all "R" resistors with wires) and binary weighting were desired, the values of the eight 2R resistors need to change to R, 2R, 4R, 8R, 16R, 32R, 64R, and 128R. It can be easily seen that very large values of resistor would be needed in the right-most positions. When integrated into silicon, these high valued resistors are also physically very large. In addition, it is difficult to accurately target such divergent values unless the resistors are constructed from an elemental value resistor, with multiples of such a resistor ganged to produce the larger values. Moreover, the monotonicity of the DAC transfer function would be limited to 9–10 bits, or 12 bits with trimming. Finally, such elemental resistors must also be carefully configured in common centroid orientations to minimize die gradient effects on their values.

By contrast, with the R-2R topology, the currents through the current sinks diminish by a precise factor of two from left to right without any increase in resistor size. Thus it is far easier to manage the binary weighting task with resistors of only R and 2R in the design, for both area and matching reasons. Yet another advantage of the R-2R scheme is that the resistor value R can remain relatively low, thereby minimizing its thermal noise contribution. Also, monotonicity is assured with R-2R ladders since each lower significant bit is based on the previous bit. Given all of the stated advantages, the R-2R topology was chosen as a foundation for the invention.

Figure 2:
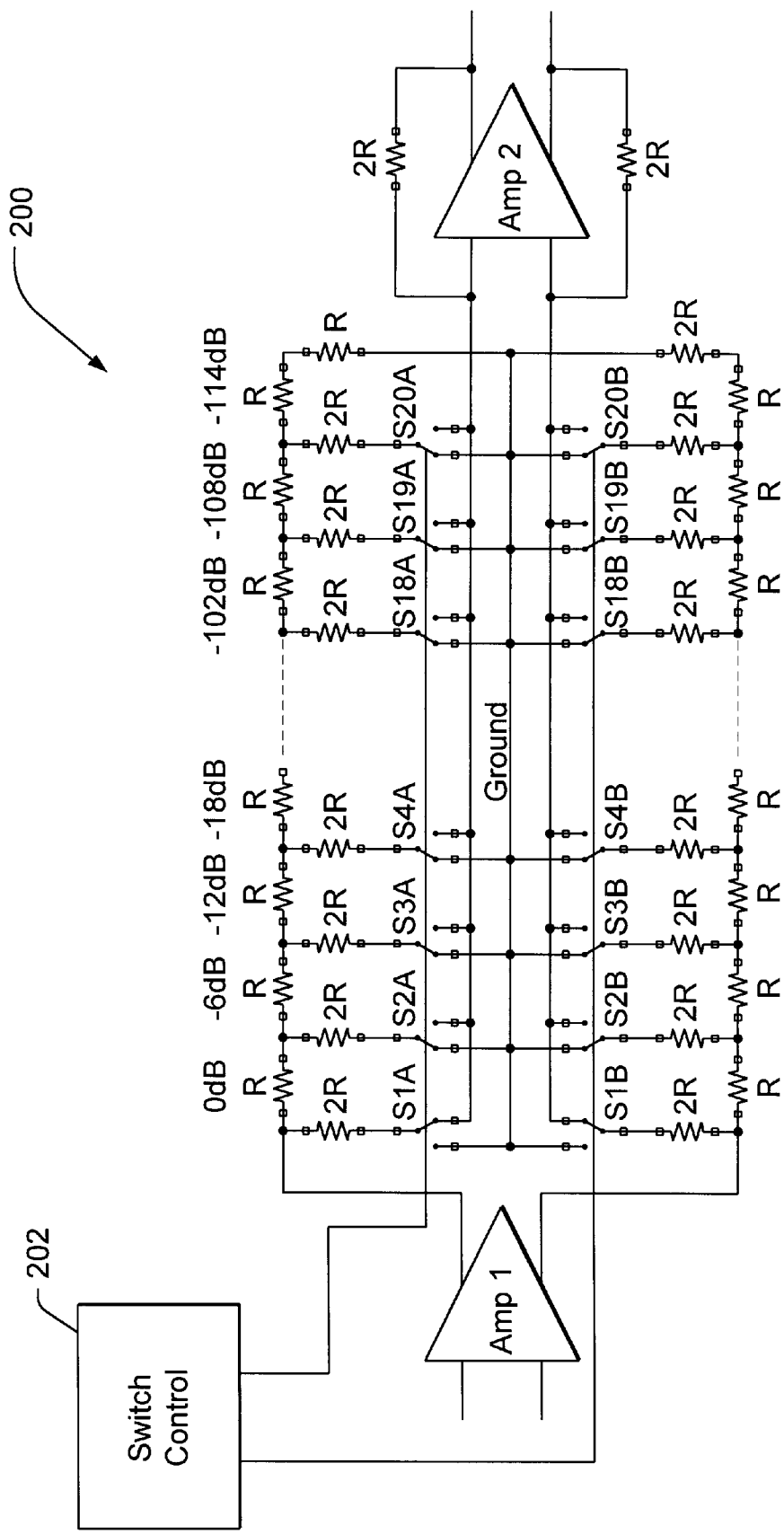
FIG. 2 is a schematic diagram of a level control circuit designed according to a specific embodiment of the invention.

FIG. 2 shows a level control circuit 200 designed according to a specific embodiment of the invention which includes an R-2R resistor ladder interposed between two differential operational amplifiers Amp1 and Amp2. For the sake of simplification, one can draw a horizontal line through the ground wire and ignore the lower half of the schematic for the basic analysis. That is, the circuit operation may be described with reference to a single-ended embodiment.

Note the "dB" values listed above the nodes of the upper half of the R-2R ladder. As discussed above, the R-2R topology inherently produces accurate –6 dB (50% attenuation) steps starting from the 0 dB node and extending to the end of the ladder, in this case to –114 dB (20 steps). It is important to note that since the Amp2 operational amplifier inputs form virtual ground nodes, each 2R resistor terminates into a zero-impedance node regardless of the position of its associated switch (SnA or SnB). According to a specific embodiment, the circuit ground of FIG. 2 may be eliminated by using the virtual ground effect of a differential signal, i.e., the ground nodes of each switch pair SnA and SnB may be tied together.

According to a specific embodiment, the switch operation scheme is as follows: only one vertical pair of switches (e.g., S1A and S1B) is switched to the Amp2 inputs at any given time; all other switches are switched to ground. When the S1A/B pair are in the Amp2 position and all other switches are in the grounded position, the 2R resistors at S1A/B act as input resistors (Rin) for Amp2. The Amp2 feedback resistors (Rf) are also 2R, so the gain from the output of Amp1 to the output of Amp2 is unity. When S2A/B are in the Amp1 input position and all others are in the grounded position, the Amp1 to Amp2 throughput gain is −6 dB. This same sequence of switch control applies through the length of the ladder for all 20 possible gain selections. While Amp2 is configured for unity gain in this example, it will be understood that a wide range of gains, positive and negative, may be employed without departing from the scope of the present invention.

This configuration has a number of significant attributes. First, the input resistance seen by Amp2 remains constant at 3R, except at or near the 0 dB setting, where Amp2's Rin becomes 2R. According to one embodiment, placement of a series resistor of 2R at the outputs of Amp1 results in a fully invariant Rin=3R for Amp2. This means that Amp2's noise gain, i.e., the input referred noise multiplied by Rf/Rin, remains essentially constant for all gain settings.

Second, the operation of the design is essentially independent of the choice of the R value, allowing it to be kept low and thereby minimizing the contribution to system noise from resistor thermal noise.

Third, the switches, which according to a specific embodiment are MOSFETs, experience no voltage variations at their terminals when passing audio signals because they always rest either on actual ground or virtual ground. This eliminates any distortion in the MOSFETs which might otherwise be introduced by variation in the source-bulk or drain-bulk diode voltages, or by variations with respect to the gate-bulk potential. The negation of these nonlinearities also allows for the devices to be scaled to a relatively small size. For example, in a system where R=13 kΩ, 150 um/0.5 um PMOS and NMOS paired transmission gate devices result in total harmonic distortion of well below −120 dB as the gain is decreases from 0 dB to −60 dB.

Fourth, the −6 dB steps are extensible indefinitely. That is, the ladder could be made arbitrarily long with only a small increase in complexity and size for each 6 dB step. Noise and distortion also remain relatively constant as ladder length increases.

Fifth, the resistors are relatively easily matched for very precise gain step values. Other, existing integrated volume control ICs lose absolute gain accuracy as attenuation increases. By contrast, circuits designed according to the present invention retain accuracy of relative gain changes, and particularly monotonicity, across all settings.

Finally, the impedance seen by the outputs of Amp1 never changes. This allows the ladder to be alternatively driven by a current output device, such as a differentially switched current output 1-bit DAC.

As will be understood, the control of switch SnA and SnB may be implemented according to a variety of techniques. For example, the switch control circuitry may comprise a configuration of logic gates which appropriately translates a digital input word representing the desired gain into on/off logic leads which control each individual switch along the ladder. Because of the variety of techniques which may be employed to control these switches, the switch control circuitry is represented as switch control 202 in FIG. 2.

The question of reducing the step size from 6 dB will now be addressed. According to a specific embodiment of the invention, 1 dB intermediate gain selections between the 6 dB steps are approximated by appropriately chosen combinatorial selection of weighted taps; that is, a combination of gain setting switches could be set to transmit audio to achieve a gain approximately 1 dB less than one of the higher 6 dB incremental steps. For example, to achieve approximately −1 dB system gain, one could enable the −6 dB, −12 dB, −18 dB, and −36 dB switches resulting in a total throughput gain of −0.972 dB. This is acceptably close to 1 dB, but has the disadvantage of reducing Rin as seen by Amp2 from 3R down to 0.75R, thereby increasing the Amp2 noise gain by 12 dB.

Figure 3:
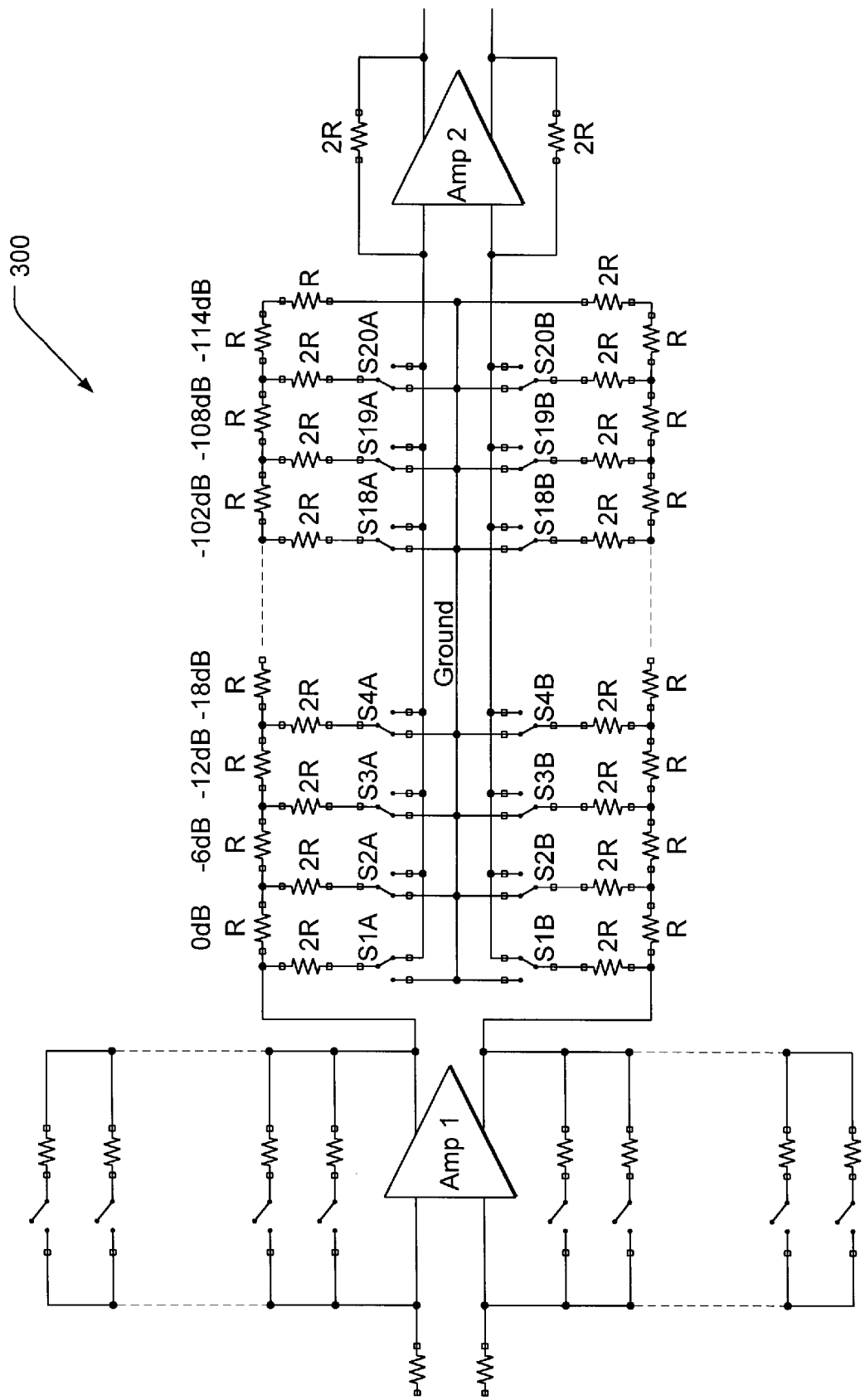
FIG. 3 is a schematic diagram of a level control circuit designed according to another specific embodiment of the invention.

An alternative technique for providing intermediate gain selections is represented by level control circuit 300 of FIG. 3, where the input op amp Amp1 is configured as a variable gain amplifier with a bank of feedback resistors to allow gain selection. Control circuitry for switches SnA and SnB is not shown for the sake of simplicity. A reasonable configuration would include a set of 6 feedback resistors per upper and lower feedback leg, with values appropriately chosen to allow the amplifier to step from 0 dB gain to −5 dB gain in 1.0 dB steps. Note that the transmission gate switches are placed at the virtual ground nodes of the op amp inputs, yielding the same low distortion discussed above. These 1.0 dB steps would provide the intermediate gain steps in between the larger 6 dB steps of the ladder. As an example of how this would work for a decreasing gain sequence, the Amp1 gain would simply be sequenced from 0 dB to −5 dB and jump back to 0 dB each time the ladder made a −6 dB step, forming a continuous 1.0 dB/step aggregate behavior throughout the entire range of the ladder. The opposite sequence would of course be performed if the gain were being increased.

Another variation on the scheme of FIG. 3 would be to employ Amp2 as the variable gain amplifier rather than Amp1. However, Amp1 may be a better choice since any modulation products and noise associated with its gain changes would be attenuated by the ladder at all but the highest volume settings. By contrast, this would not be the case if Amp2 were used as the variable gain amplifier.

Alternatively, if the R-2R ladder is driven by a current output device such as for example, a 1-bit current output DAC, that current could be varied to provide the intermediate gain steps. It will be understood that a variety of variable gain techniques, as well as gain step sizes other than 1.0 dB, could be used to implement the intermediate gain step function.

Figure 4:
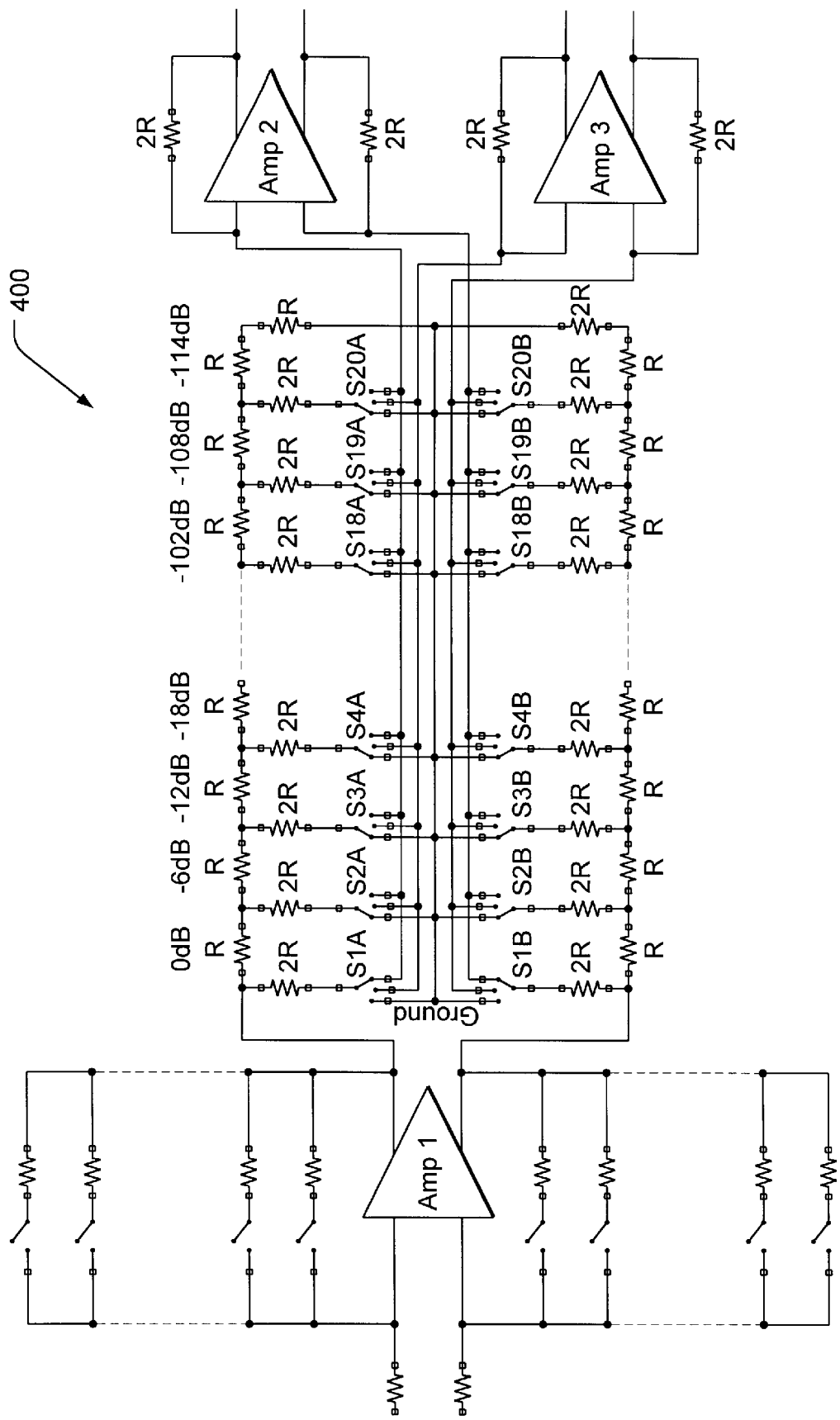
FIG. 4 is a schematic diagram of a level control circuit designed according to yet another specific embodiment of the invention.

The number of independent outputs from the R-2R ladder is also extensible. Control circuit 400 of FIG. 4 shows a third op amp Amp3 being used with a separate set of paired taps along the ladder. Control circuitry for switches SnA and SnB is not shown for the sake of simplicity. Any pair of switches can feed Amp2 while any other pair of switches feeds Amp3 as long as all of the remaining switches are grounded and Amp2 and Amp3 never attempt to share the same tap pair. In this configuration, there can be a slight introduction of input-referred noise from Amp2 into Amp3 and vice versa if the tap selections are adjacent. However, the contribution is less than 2 dB, assuming Amp2 and Amp3 have similar input referred noise. If the tap selections are at least one grounded tap apart, the shared noise is negligible due to the ladder's natural attenuating characteristics.

Figure 5:
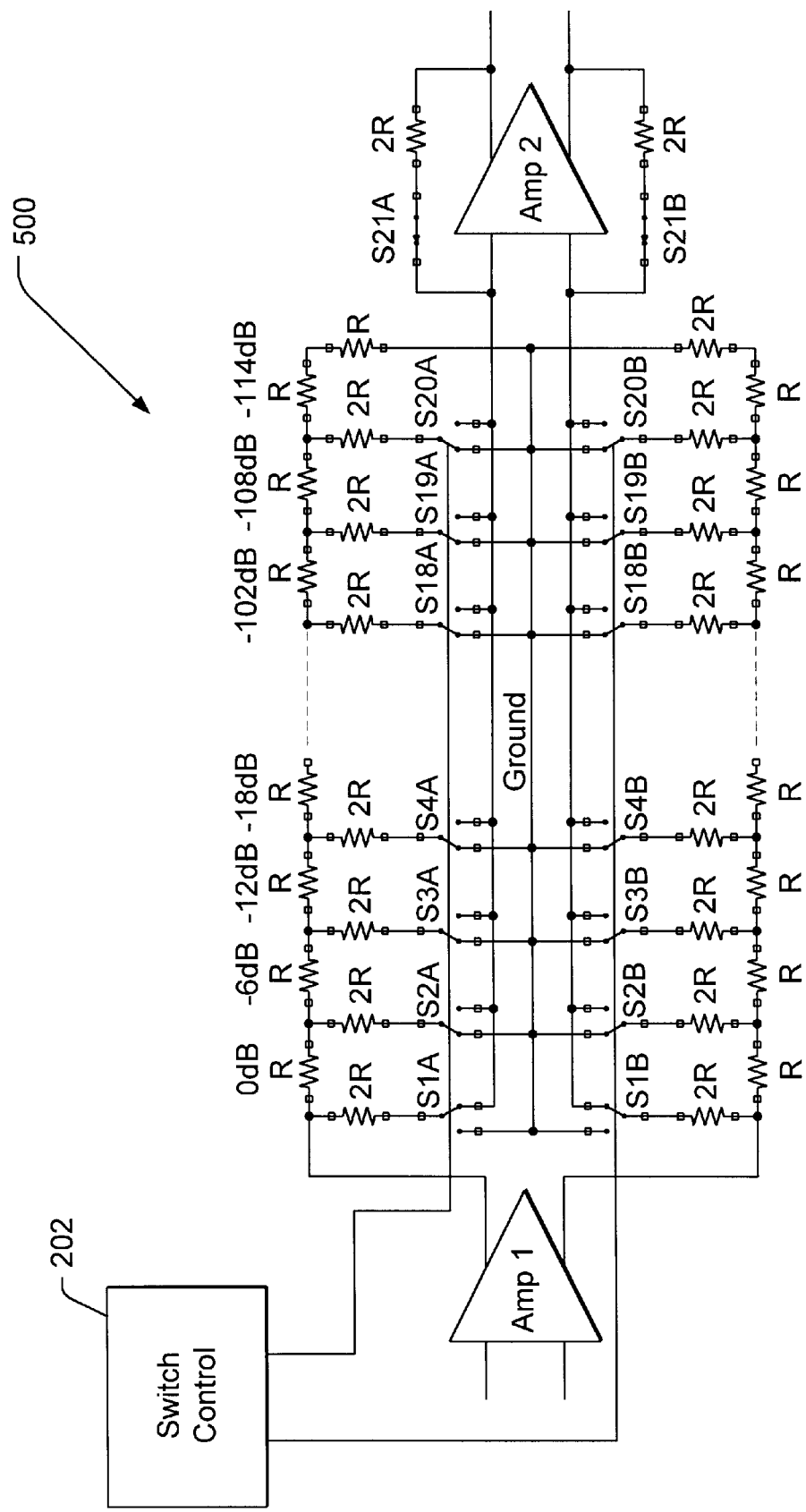
FIG. 5 is a schematic diagram of a level control circuit designed according to still another specific embodiment of the invention.

In addition, the feedback network at Amp2 can be enhanced for greater linearity with the inclusion of S21A and S21B as shown in control circuit 500 of FIG. 5. It can be shown that by the inclusion of these additional switches the feedback impedances (i.e., 2R+Z(S21A) and 2R+Z (S21B)) would be identical to the input impedances (i.e., 2R+Z(S1A), 2R+Z(S1B), . . . 2R+Z(S20A), and 2R+Z (S20B)) if all input and feedback switches were constructed substantially identically, even if the switches exhibited some degree of non-linear behavior. This is readily apparent from the gain equation for an op amp in this configuration:

$$V_o = -\frac{R_F}{R_{IN}}V_{IN} = -\frac{2R + Z(\text{switch})}{2R + Z(\text{switch})}V_{IN} = -V_{IN}$$

It will be understood that the embodiments of the invention described above with reference to FIGS. 2–5 may be implemented in a variety of ways. For example, discrete components may be used. Alternatively, each of the embodiments may be implemented in an integrated circuit using any of a wide variety of IC fabrication processes including, for example, CMOS and BiCMOS processes.

While the invention has been particularly shown and described with reference to specific embodiments thereof, it will be understood by those skilled in the art that changes in the form and details of the disclosed embodiments may be made without departing from the spirit or scope of the invention. For example, the embodiments described above may be implemented using discrete circuit elements as well as in integrated circuits. Moreover, embodiments of the present invention may be employed to control the level of a wide variety of signal types and should not be restricted merely to the control of audio signal levels. In addition and as mentioned above, the invention may be implemented in both differential and single-ended configurations. Therefore, the scope of the invention should be determined with reference to the appended claims.

What is claimed is:

1. A control circuit for controlling a level of a signal and transmitting the signal to a first amplifier, comprising:
   a first R-2R resistor network for receiving the signal, the first R-2R resistor network having a first plurality of resistor nodes;
   a first plurality of switches coupled to the first plurality of resistor nodes for alternately connecting each of the first plurality of resistor nodes to one of a plurality of low impedance nodes and a first low impedance input node associated with the first amplifier; and
   switch control circuitry for selectively controlling the first plurality of switches to transmit the signal to the first low impedance input node.

2. The control circuit of claim 1 further comprising a variable gain amplifier coupled to the first R-2R resistor network, the variable gain amplifier providing for greater resolution control of the level of the signal as compared to the first R-2R resistor network alone.

3. The control circuit of claim 2 wherein the first R-2R resistor network controls the level of the signal in approximately 6 dB increments, the variable gain amplifier controlling the level of the signal in approximately 1 dB increments within each 6 dB increment.

4. The control circuit of claim 1 wherein the first amplifier comprises a variable gain which provides greater resolution control of the level of the signal as compared to the first R-2R resistor network alone.

5. The control circuit of claim 4 wherein the first R-2R resistor network controls the level of the signal in approximately 6 dB increments, the variable gain amplifier controlling the level of the signal in approximately 1 dB increments within each 6 dB increment.

6. The control circuit of claim 1 wherein the plurality of low impedance nodes are coupled to ground.

7. The control circuit of claim 1 wherein first ones of the plurality of low impedance nodes are coupled to ground and second ones of the plurality of low impedance nodes are coupled to a second low impedance input node associated with a second amplifier.

8. The control circuit of claim 1 wherein the first amplifier is a differential amplifier having a second low impedance input node associated therewith and the signal is a differential signal, the control circuit further comprising:
   a second R-2R resistor network for receiving a portion of the differential signal, the second R-2R resistor network having a second plurality of resistor nodes; and
   a second plurality of switches coupled to the second plurality of resistor nodes for alternately connecting each of the second plurality of resistor nodes to one of the plurality of low impedance nodes and the second low impedance input node;
   wherein the switch control circuitry selectively controls the second plurality of switches to transmit the portion of the differential signal to the second low impedance input node.

9. The control circuit of claim 1 wherein the first amplifier is configured for unity gain when the switch control circuitry configures the first plurality of switches to transmit the signal to the first low impedance input node.

10. The control circuit of claim 1 wherein the first R-2R resistor network has an input impedance associated therewith, the input impedance remaining constant regardless of which of the first plurality of resistor nodes is connected to the first low impedance input node.

11. A circuit for coupling to an amplifier the circuit comprising:
   an R-2R resistor network having a plurality of resistor nodes; and
   a plurality of switches coupled to the plurality of resistor nodes for alternately connecting each of the plurality of resistor nodes to one of a plurality of low impedance nodes and a first low impedance input node associated with the amplifier.

12. A method for controlling a level of a signal and transmitting the signal to an amplifier, comprising:
   introducing the signal to a control circuit comprising an R-2R resistor network having a plurality of resistor nodes, the control circuit also having a plurality of switches coupled to the plurality of resistor nodes for alternately connecting each of the plurality of resistor nodes to one of a plurality of low impedance nodes and a low impedance input node associated with the amplifier; and
   selectively controlling the plurality of switches to connect at least one of the plurality of resistor nodes to the low impedance input node thereby controlling the level of the signal and transmitting the signal to the amplifier.

13. An audio component comprising a volume control circuit for controlling a level of an audio signal and transmitting the signal to an amplifier, the volume control circuit comprising:
   an R-2R resistor network for receiving the audio signal, the R-2R resistor network having a plurality of resistor nodes;

a plurality of switches coupled to the plurality of resistor nodes for alternately connecting each of the plurality of resistor nodes to one of a plurality of low impedance nodes and a low impedance input node associated with the amplifier;

switch control circuitry for selectively controlling the plurality of switches to transmit the audio signal to the low impedance input node.

14. An integrated circuit for controlling a level of a differential audio signal, comprising:

a first differential amplifier for receiving the differential audio signal, the first differential amplifier having first and second differential output terminals;

a first R-2R resistor network coupled to the first differential output terminal, the first R-2R resistor network having a first plurality of resistor nodes;

a first plurality of switches coupled to the first plurality of resistor nodes for alternately connecting each of the first plurality of resistor nodes to one of a plurality of low impedance nodes and a first low impedance input node;

a second R-2R resistor network coupled to the second differential output terminal, the second R-2R resistor network having a second plurality of resistor nodes;

a second plurality of switches coupled to the second plurality of resistor nodes for alternately connecting each of the second plurality of resistor nodes to one of the plurality of low impedance nodes and a second low impedance input node;

switch control circuitry for selectively controlling the first and second pluralities of switches; and a second differential amplifier having first and second differential input terminals coupled to the first and second low impedance input nodes.

15. The integrated circuit of claim 14 wherein the first differential amplifier is configured as a variable gain amplifier.

16. The integrated circuit of claim 14 wherein the second differential amplifier is configured as a variable gain amplifier.

17. The integrated circuit of claim 14 wherein the first and second differential amplifiers, first and second R-2R resistor networks, first and second pluralities of switches, and the switch control circuitry are formed using a CMOS fabrication process.

* * * * *